United States Patent
Ruan et al.

(10) Patent No.: US 11,668,755 B2
(45) Date of Patent: *Jun. 6, 2023

(54) METHOD AND APPARATUS FOR DETERMINING AVAILABLE ENERGY OF BATTERY, MANAGEMENT SYSTEM, AND STORAGE MEDIUM

(71) Applicant: CONTEMPORARY AMPEREX TECHNOLOGY CO., LIMITED, Ningde (CN)

(72) Inventors: Jian Ruan, Ningde (CN); Mingshu Du, Ningde (CN); Shenzhi Tang, Ningde (CN); Shichao Li, Ningde (CN); Yanhua Lu, Ningde (CN); Wei Zhang, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 80 days.

This patent is subject to a terminal disclaimer.

(21) Appl. No.: 17/138,547

(22) Filed: Dec. 30, 2020

(65) Prior Publication Data

US 2021/0148981 A1 May 20, 2021

Related U.S. Application Data

(63) Continuation of application No. PCT/CN2020/084334, filed on Apr. 11, 2020.

(30) Foreign Application Priority Data

Apr. 25, 2019 (CN) .......................... 201910338269.3

(51) Int. Cl.
*G01R 31/367* (2019.01)
*G01R 31/36* (2020.01)
(Continued)

(52) U.S. Cl.
CPC ......... *G01R 31/367* (2019.01); *G01R 31/388* (2019.01); *G01R 31/3648* (2013.01);
(Continued)

(58) Field of Classification Search
CPC ................ G01R 31/367; G01R 31/388; G01R 31/3648; G01R 31/374; G01R 31/382; G01R 31/3842
See application file for complete search history.

(56) References Cited

U.S. PATENT DOCUMENTS

2002/0195999 A1* 12/2002 Kimura ................. B60L 3/0046
320/134
2006/0158155 A1* 7/2006 Tamezane ............ G01R 31/367
320/132
(Continued)

FOREIGN PATENT DOCUMENTS

CN 105203963 A 12/2015
CN 103257323 B 3/2016
(Continued)

OTHER PUBLICATIONS

Machine translation ofCN 109085507 A, downloaded Nov. 2022 (Year: 2022).*
(Continued)

*Primary Examiner* — John C Kuan
(74) *Attorney, Agent, or Firm* — Morgan, Lewis & Bockius LLP (57) ABSTRACT

This disclosure provides a method and an apparatus for determining available energy of a battery, a battery management system, and a storage medium, and relates to the field of battery technologies. The method includes: obtaining a DOD interval corresponding to a current SOC interval of the battery, and a cycle quantity and a cycle temperature that correspond to the DOD interval; obtaining recoverable
(Continued)

energy information of the battery based on the DOD interval, the cycle quantity, and the cycle temperature; and determining current remaining available energy of the battery based on the recoverable energy information. For a battery with a recoverable attenuation capacity, the method, the apparatus, the battery management system, and the storage medium in this disclosure could help improve accuracy in estimating remaining available energy of the battery, thereby improving battery reliability, prolonging a service life of the battery, and enhancing user experience.

13 Claims, 5 Drawing Sheets

(51) Int. Cl.
  _G01R 31/382_ (2019.01)
  _G01R 31/388_ (2019.01)
  _G01R 31/3842_ (2019.01)
  _G01R 31/374_ (2019.01)

(52) U.S. Cl.
  CPC .......... _G01R 31/374_ (2019.01); _G01R 31/382_ (2019.01); _G01R 31/3842_ (2019.01)

(56) References Cited

U.S. PATENT DOCUMENTS

| | | |
|---|---|---|
| 2014/0379284 A1 | 12/2014 | Heo et al. |
| 2017/0371000 A1 | 12/2017 | Fukushima et al. |
| 2018/0095141 A1 | 4/2018 | Wild et al. |
| 2018/0113174 A1 | 4/2018 | Furukawa et al. |

FOREIGN PATENT DOCUMENTS

| | | | |
|---|---|---|---|
| CN | 105425156 A | * | 3/2016 |
| CN | 105425156 A | | 3/2016 |
| CN | 105738814 A | | 7/2016 |
| CN | 105738814 A | | 7/2016 |
| CN | 105974326 A | | 9/2016 |
| CN | 105974326 A | | 9/2016 |
| CN | 106909716 A | | 6/2017 |
| CN | 107436418 A | | 12/2017 |
| CN | 107492685 A | | 12/2017 |
| CN | 107742755 A | | 2/2018 |
| CN | 107894571 A | | 4/2018 |
| CN | 107953786 A | | 4/2018 |
| CN | 108761343 A | | 11/2018 |
| CN | 109085507 A | * | 12/2018 |
| CN | 109507611 A | | 3/2019 |
| CN | 110988690 A | | 4/2020 |
| CN | 110988702 A | | 4/2020 |
| CN | 108196200 A | | 6/2022 |
| EP | 2916422 A1 | | 9/2015 |
| EP | 3734309 A1 | | 11/2020 |
| FR | 2946150 B1 | | 5/2011 |
| JP | 09211090 A | | 8/1997 |
| WO | WO 2015/158813 A1 | | 10/2015 |

OTHER PUBLICATIONS

Machine translation of CN 105425156 A, downloaded Nov. 2022 (Year: 2022).*
Contemporary Amperex Technology Co., Limited, International Search Report and Written Opinion, PCT/CN2020/084335, dated Jul. 17, 2020, 17 pgs.
Contemporary Amperex Technology Co., Limited, Extended European Search Report, EP20794953.8, dated Jul. 23, 2021, 8 pgs.
Contemporary Amperex Technology Co., Limited, First Office Action, CN2019103382693.3, dated Aug. 11, 2020, 15 pgs.
Contemporary Amperex Technology Co., Limited, International Search Report and Written Opinion, PCT/CN2020/084334, dated Jul. 15, 2020, 21 pgs.

* cited by examiner

METHOD AND APPARATUS FOR DETERMINING AVAILABLE ENERGY OF BATTERY, MANAGEMENT SYSTEM, AND STORAGE MEDIUM

CROSS-REFERENCE TO RELATED APPLICATIONS

This application is a continuation application of PCT Patent Application No. PCT/CN2020/084334, entitled "AVAILABLE BATTERY ENERGY DETERMINATION METHOD AND DEVICE, MANAGEMENT SYSTEM AND STORAGE MEDIUM" filed on Apr. 11, 2020, which claims priority to Chinese Patent Application No. 201910338269.3, filed with the State Intellectual Property Office of the People's Republic of China on Apr. 25, 2019, and entitled "METHOD AND APPARATUS FOR DETERMINING AVAILABLE ENERGY OF BATTERY, MANAGEMENT SYSTEM, AND STORAGE MEDIUM", all of which are incorporated herein by reference in their entirety.

TECHNICAL FIELD

This disclosure relates to the field of battery technologies, and in particular, to a method and an apparatus for determining available energy of a battery, a battery management system, and a storage medium.

BACKGROUND

A battery capacity means a magnitude of an electric quantity stored in a battery. Accurate estimation of an available capacity of the battery is of great significance to estimation of a remaining capacity, remaining energy, and the like, and is also an important parameter reflecting an aging state of a battery cell. However, there are two parts of capacity attenuation for some batteries: non-recoverable capacity attenuation and recoverable capacity attenuation (similar to a memory effect). The non-recoverable capacity attenuation reflects real aging of the batteries and a reduction of real available energy, whereas the recoverable capacity attenuation reduces actual available energy of the batteries, but this part of recoverable energy attenuation amount is affected by historical operating conditions, and therefore is difficult to estimate by using a current energy pre-estimation algorithm (for example, a table look-up method), resulting in inaccurate estimation of remaining available energy of the batteries.

SUMMARY

In view of this, a technical issue to be addressed in this disclosure is to provide a method and an apparatus for determining available energy of a battery, a battery management system, and a storage medium.

According to a first aspect of this disclosure, a method for determining available energy of a battery is provided, including: obtaining a depth of discharge (DOD) interval corresponding to a state of charge (SOC) interval for battery operating; obtaining a cycle quantity and a cycle temperature that correspond to the DOD interval; obtaining recoverable energy information of the battery based on the DOD interval, the cycle quantity, and the cycle temperature; and determining current remaining available energy of the battery based on the recoverable energy information.

In a specific embodiment, the recoverable energy information includes a recoverable energy attenuation amount, a recoverable energy attenuation variation, or a recoverable capacity attenuation amount.

In an embodiment, the obtaining a DOD interval corresponding to an SOC interval for battery operating includes: obtaining setting information for DOD interval setting in an SOC usage interval corresponding to the battery; and determining, based on the setting information, the DOD interval corresponding to the SOC interval.

In an embodiment, the obtaining recoverable energy information of the battery based on the DOD interval, the cycle quantity, and the cycle temperature includes: pre-establishing correspondence information between the recoverable energy information, and the DOD interval, the cycle quantity, and the cycle temperature; and obtaining, based on the correspondence information, the recoverable energy information corresponding to the DOD interval and the cycle quantity.

In a specific embodiment, the determining current remaining available energy of the battery based on the recoverable energy information includes: obtaining, based on battery state information, first battery remaining available energy corresponding to a state of the battery without a recoverable attenuation capacity; and calculating current remaining available energy of the battery based on the first battery remaining available energy and a recoverable energy attenuation amount; or calculating current remaining available energy of the battery based on the first battery remaining available energy and a recoverable energy attenuation variation.

In an embodiment, the obtaining, based on the correspondence information, the recoverable energy information corresponding to the DOD interval and the cycle quantity includes: obtaining, based on the correspondence information as well as the DOD intervals, the cycle quantities, and the cycle temperatures, an interval-specific recoverable energy attenuation amount corresponding to each of the DOD intervals; and obtaining the recoverable energy attenuation amount for current operating of the battery based on at least one of the obtained interval-specific recoverable energy attenuation amounts.

In an embodiment, the calculating current remaining available energy of the battery based on the first battery remaining available energy and a recoverable energy attenuation amount includes: subtracting the recoverable energy attenuation amount from the first battery remaining available energy, to obtain the current remaining available energy of the battery.

In an embodiment, the obtaining, based on the correspondence information, the recoverable energy information corresponding to the DOD interval and the cycle quantity includes: obtaining, based on the correspondence information as well as the DOD intervals, the cycle quantities, and the cycle temperatures, an interval-specific recoverable energy attenuation variation corresponding to each of the DOD intervals; and obtaining the recoverable energy attenuation variation for current operating of the battery based on at least one of the obtained interval-specific recoverable energy attenuation variations.

In an embodiment, the calculating current remaining available energy of the battery based on the first battery remaining available energy and a recoverable energy attenuation amount includes: obtaining the recoverable energy attenuation amount for current operating of the battery based on a recoverable energy attenuation amount corresponding to last operating of the battery and the recoverable energy attenuation variation corresponding to the current operating of the battery; and subtracting the recoverable energy attenuation amount from the first battery remaining available energy, to obtain the current remaining available energy of the battery.

In an embodiment, the determining current remaining available energy of the battery based on the recoverable energy information includes: obtaining a first available capacity of the battery based on battery operating data; and calculating current remaining available energy of the battery based on the first available capacity and the recoverable capacity attenuation amount.

In an embodiment, the obtaining, based on the correspondence information, the recoverable energy information corresponding to the DOD interval and the cycle quantity includes: obtaining, based on the correspondence information as well as the DOD intervals, the cycle quantities, and the cycle temperatures, an interval-specific recoverable capacity attenuation amount corresponding to each of the DOD intervals; and obtaining the recoverable capacity attenuation amount based on at least one of the obtained interval-specific recoverable capacity attenuation amounts.

In an embodiment, the calculating current remaining available energy of the battery based on the first available capacity and a recoverable capacity attenuation amount includes: subtracting the recoverable capacity attenuation amount from the first available capacity, to obtain a current available capacity of the battery; and obtaining the current remaining available energy of the battery based on the current available capacity of the battery and voltage information of the battery.

In an embodiment, the obtaining, based on battery state information, first battery remaining available energy corresponding to a state of the battery without a recoverable attenuation capacity includes: pre-establishing a mapping relationship between first battery remaining available energy, and SOCs and temperatures of the battery; and obtaining the first battery remaining available energy based on the mapping relationship and the battery state information, where the battery state information includes SOC and temperature information.

According to another aspect of this disclosure, an apparatus for determining available energy of a battery is provided, including: an information obtaining module, configured to obtain a DOD interval corresponding to an SOC interval for battery operating, and obtain a cycle quantity and a cycle temperature that correspond to the DOD interval; a recoverable energy obtaining module, configured to obtain recoverable energy information of the battery based on the DOD interval, the cycle quantity, and the cycle temperature; and an available energy correction module, configured to determine current remaining available energy of the battery based on the recoverable energy information.

According to still another aspect of this disclosure, a battery management system is provided, including the foregoing apparatus for determining available energy of a battery.

According to yet another aspect of this disclosure, a computer readable storage medium, where the computer readable storage medium stores a computer instruction, and the instruction is executed by a processor to implement the foregoing method.

According to the method and the apparatus for determining available energy of a battery, the battery management system, and the storage medium in this disclosure, the DOD interval corresponding to the SOC interval for battery operating, and the cycle quantity and the cycle temperature that correspond to the DOD interval are obtained; the recoverable energy information of the battery is obtained based on the DOD interval, the cycle quantity, and the cycle temperature; and the current remaining available energy of the battery is corrected. For a battery with a recoverable attenuation capacity, this could help improve accuracy in estimating remaining available energy of the battery, thereby improving battery reliability and prolonging a service life of the battery.

BRIEF DESCRIPTION OF DRAWINGS

To describe the technical solutions in the embodiments of this disclosure or in the prior art more clearly, the following briefly describes the accompanying drawings required for describing the embodiments or the prior art. Apparently, the accompanying drawings in the following description show merely some embodiments of this disclosure, and a person of ordinary skill in the art may still derive other drawings from these accompanying drawings without creative efforts.

DESCRIPTION OF EMBODIMENTS

The following describes this disclosure more comprehensively with reference to the accompanying drawings, where example embodiments of this disclosure are described. The following clearly and completely describes the technical solutions in the embodiments of this disclosure with reference to the accompanying drawings in the embodiments of this disclosure. Apparently, the described embodiments are merely some but not all of the embodiments of this disclosure. All other embodiments obtained by a person of ordinary skill in the art based on the embodiments of this disclosure without creative efforts fall within the protection scope of this disclosure. The following describes the technical solutions in this disclosure in various aspects with reference to various drawings and embodiments.

"First", "second", and the like in the following description are merely intended for differentiation in description, and have no other special meanings.

Figure 1:
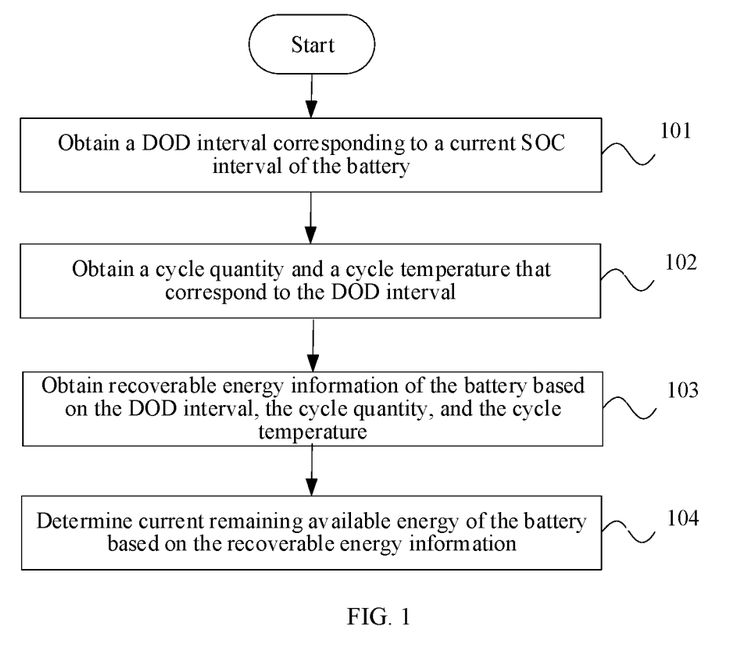
FIG. 1 is a schematic flowchart of an embodiment of a method for determining available energy of a battery according to this disclosure.

FIG. 1 is a schematic flowchart of an embodiment of a method for determining available energy of a battery according to this disclosure. As shown in FIG. 1:

Step 101. Obtain a depth of discharge (DOD) interval corresponding to a current state of charge (SOC) interval of the battery at operation.

The battery may be a battery cell, a battery string, a module, a battery pack, or the like that is characterized by a recoverable attenuation capacity. For example, the battery is a lithium battery or a lithium battery string. The battery operating means battery charge/discharge cyclic operating. The DOD interval means an SOC operating interval that is set within an SOC usage interval corresponding to the battery. During charging or discharging of the battery, an SOC interval corresponding to the charging or discharging of the battery may be determined, and a DOD interval corresponding to the SOC interval may be determined.

For example, the SOC usage interval corresponding to the battery is 0-100%, five DOD intervals are set in the SOC usage interval, and the five DOD intervals are 0-20%, 20-40%, 40-60%, 60-80%, and 80-100%. If the battery is discharged once, an SOC interval corresponding to current charging of the battery is 80-20%. In this case, the SOC interval of 80-20% corresponds to three DOD intervals: a DOD interval of 20-40%, a DOD interval of 40-60%, and a DOD interval of 60-80%.

Step 102. Obtain a cycle quantity and a cycle temperature that correspond to the DOD interval.

The cycle quantity is a quantity of times of cyclic operating of the battery in the DOD interval. For example, a cycle quantity that corresponds to the DOD interval of 20-40% is a quantity of charge-discharge cycles of the battery in the DOD interval of 20-40%. The cycle temperature is battery temperature at which the battery operates in the DOD interval. For example, cycle temperature corresponding to the DOD interval of 20-40% is battery temperature of the battery in the DOD interval of 20-40%.

Step 103. Obtain recoverable energy information of the battery based on the DOD interval, the cycle quantity, and the cycle temperature.

The recoverable energy information includes a recoverable energy attenuation amount, a recoverable energy attenuation variation, a recoverable capacity attenuation amount, or the like. There may be a plurality of methods for obtaining the recoverable energy attenuation amount, the recoverable energy attenuation variation, or the recoverable capacity attenuation amount based on the DOD interval, the cycle quantity, and the cycle temperature.

For example, a magnitude of the recoverable energy attenuation amount, the recoverable energy attenuation variation, or the recoverable capacity attenuation amount may be obtained through an experiment; a correspondence between the magnitude of the recoverable energy attenuation amount, the recoverable energy attenuation variation, or the recoverable capacity attenuation amount, and the DOD interval, the cycle quantity, and the cycle temperature is established; and the recoverable energy information is obtained based on the correspondence.

Step 104. Determine current remaining available energy of the battery based on the recoverable energy information.

The current remaining available energy of the battery may be corrected based on the recoverable energy attenuation amount, the recoverable energy attenuation variation, the recoverable capacity attenuation amount, or the like. There may be two parts during charging and discharging procedures of the battery: unrecoverable capacity attenuation and recoverable capacity attenuation. The unrecoverable capacity attenuation is capacity unavailability due to aging of a battery cell of the battery. The recoverable capacity attenuation is a capacity that can be released again after the battery cell undergoes specific adjustment during cyclic operating, and this part of capacity cannot reflect an aging state of the battery cell.

Due to existence of the recoverable capacity attenuation, a part of battery energy cannot be fully released, whereas all energy that can be released in a current state is generally represented when remaining available energy is demarcated for the battery. Therefore, the recoverable capacity attenuation overestimates energy that can be currently released, and the current remaining available energy of the battery needs to be corrected.

In an embodiment, there may be a plurality of manners of obtaining a DOD interval corresponding to an SOC interval for battery operating. For example, setting information for DOD interval setting in an SOC usage interval corresponding to the battery is obtained, and the DOD interval corresponding to the SOC interval is determined based on the setting information.

For example, the setting information for DOD interval setting in an SOC usage interval corresponding to the battery is information about five DOD intervals, and the five DOD intervals are 0-20%, 20-40%, 40-60%, 60-80%, and 80-100%. It is determined, based on the setting information, that DOD intervals corresponding to an SOC interval of 20-60% are a DOD interval of 20-40% and a DOD interval of 40-60%.

Figure 2:
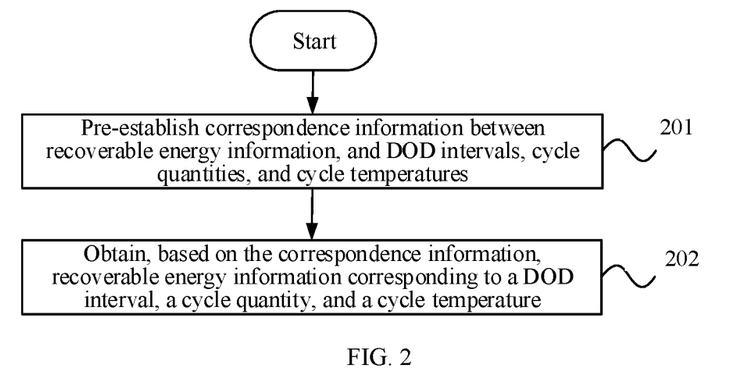
FIG. 2 is a schematic flowchart of obtaining recoverable energy information in an embodiment of a method for determining available energy of a battery according to this disclosure.

FIG. 2 is a schematic flowchart of obtaining recoverable energy information in an embodiment of a method for determining available energy of a battery according to this disclosure. As shown in FIG. 2:

Step 201. Pre-establish correspondence information between recoverable energy information, and DOD intervals, cycle quantities, and cycle temperatures.

Step 202. Obtain, based on the correspondence information, recoverable energy information corresponding to a DOD interval and a cycle quantity.

There may be a plurality of methods for establishing the correspondence information. Recoverable energy attenuation amounts, recoverable energy attenuation variations, or recoverable capacity attenuation amounts corresponding to different DOD intervals, different cycle quantities, and different cycle temperatures are demarcated through offline experiments. An offline operating condition cycle test is performed on a battery characterized by recoverable capacity attenuation, to test recoverable energy attenuation amounts, recoverable energy attenuation variations, or recoverable capacity attenuation amounts corresponding to different DOD intervals, different cycle quantities, and different cycle temperatures. The recoverable energy attenuation amounts, the recoverable energy attenuation variations, or the recoverable capacity attenuation amounts of the battery may be obtained through a plurality of capacity test and energy test procedures.

For example, during a battery cell capacity test, a battery cell capacity is tested, and available capacities and energy of several battery cells without recoverable capacity attenuation amounts in full charge and full discharge cycles are counted; then an operating condition for testing an attenuation capacity of a battery cell is formulated: cyclically using battery cells and parallel samples of battery cells in different DOD intervals and different cycle temperature conditions; after several cycles, a charge and discharge capacity and charge and discharge energy of some of the battery cells are detected; cycling is continued for other battery cells, and a charge and discharge capacity and charge and discharge energy are measured after N cycles; finally, by using the battery capacity test and the full charge and full discharge cycles, available capacities and energy of battery cells without recoverable capacity attenuation amounts under a current condition are counted.

A functional correspondence, a tabular correspondence, or the like between recoverable energy attenuation amounts, recoverable energy attenuation variations, or recoverable capacity attenuation amounts, and DOD intervals, cycle quantities, and cycle temperatures is counted and analyzed. For example, a table of correspondence between recoverable energy attenuation amounts, and DOD intervals, cycle quantities, and cycle temperatures is established, as shown in Table 1.

Under T1:

TABLE 1

Table of correspondence between recoverable energy attenuation amounts, and DOD intervals and cycle quantities under T1

| Recoverable energy attenuation amount | N1 | N2 | ... | NX |
|---|---|---|---|---|
| [S1, S2] | E1 | E2 | ... | EX |
| ... | ... | ... | ... | ... |
| [SA, SB] | E1A | E1B | ... | E1X |

In Table 1, T1 is the cycle temperature; N1, N2, ..., and NX represent different cycle quantities; [S1, S2], ..., and [SA, SB] represent different DOD intervals; and E1, ..., and E1X in Table 1 represent interval-specific recoverable energy attenuation amounts of the battery under different operating conditions, or E1, ..., and E1X may represent interval-specific recoverable energy attenuation variations of the battery under different operating conditions. E1, ..., and E1X may be obtained through related tests, experiments, or the like.

The correspondence between recoverable energy attenuation amounts, and DOD intervals, cycle quantities, and cycle temperatures may be alternatively included in a plurality of tables under different temperatures. For example, a plurality of cycle temperatures such as T2, T3, and T4 are set for a specific battery, and related tests and experiments are performed to obtain a plurality of tables in which recoverable energy attenuation amounts correspond to DOD intervals and cycle quantities under the plurality of cycle temperatures such as T2, T3, and T4. Content of each table is shown in Table 1.

A table of correspondence between recoverable capacity attenuation amounts, and DOD intervals, cycle quantities, and cycle temperatures is established, as shown in Table 2.

Under T1:

TABLE 2

Table of correspondence between recoverable capacity attenuation amounts, and DOD intervals and cycle quantities under T1

| Recoverable capacity attenuation amount | N1 | N2 | ... | NX |
|---|---|---|---|---|
| [S1, S2] | D1 | D2 | ... | DX |
| ... | ... | ... | ... | ... |
| [SA, SB] | D1A | D1B | ... | D1X |

In Table 2, T1 is the cycle temperature; N1, N2, ..., and NX represent different cycle quantities; [S1, S2], ..., and [SA, SB] represent different DOD intervals; and D1, ..., and D1X in Table 2 represent interval-specific recoverable capacity attenuation amounts of the battery under different operating conditions. D1, ..., and D1X may be positive or negative values. D1, ..., and D1X may be obtained through related tests and experiments.

The correspondence between recoverable capacity attenuation amounts, and DOD intervals, cycle quantities, and cycle temperatures may be alternatively included in a plurality of tables under different temperatures. For example, a plurality of cycle temperatures such as T2, T3, and T4 are set for a specific battery, and related tests and experiments are performed to obtain a plurality of tables in which recoverable capacity attenuation amounts correspond to DOD intervals and cycle quantities under the plurality of cycle temperatures such as T2, T3, and T4. Content of each table is shown in Table 2.

In an embodiment, if the SOC interval cannot correspond to a plurality of complete DOD intervals, for example, an interval segment of 30-40 in an SOC interval of 30-60% corresponds to a DOD interval of 20-40%, a cycle quantity and a cycle temperature that correspond to the DOD interval of 20-40% are determined, and a corresponding coefficient is set. When recoverable energy information is obtained, the coefficient is multiplied by an interval-specific recoverable energy attenuation amount, an interval-specific recoverable energy attenuation variation, or an interval-specific recoverable capacity attenuation amount that corresponds to the DOD interval of 20-40%, the cycle quantity, and the cycle temperature. Similarly, if the cycle temperature is between T1 and T2, the cycle temperature may be determined as T1, and a corresponding coefficient may be set. When recoverable energy information is obtained, an interval-specific recoverable energy attenuation amount, an interval-specific recoverable energy attenuation variation, or an interval-specific recoverable capacity attenuation amount under T1 is multiplied by the coefficient.

In addition to using a tabular correspondence, a functional relationship may also be obtained through function fitting for the correspondence between recoverable energy attenuation amounts, recoverable energy attenuation variations, or recoverable capacity attenuation amounts, and DOD intervals, cycle quantities, and cycle temperatures. A regression equation, a neural network method, or the like may be used.

Figure 3:
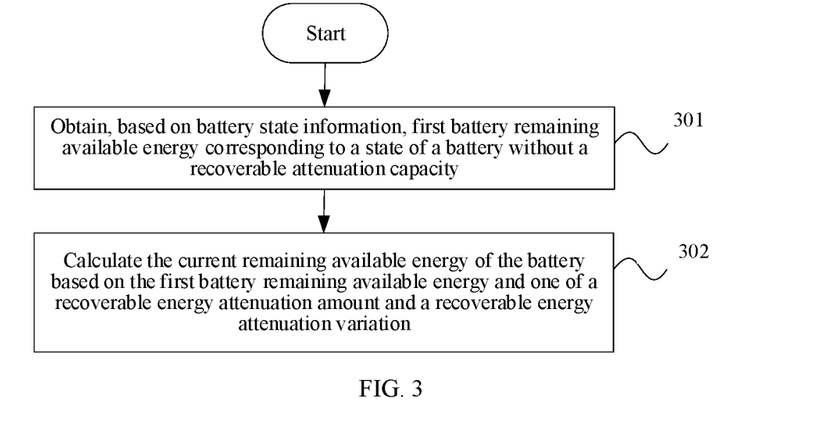
FIG. 3 is a schematic diagram of obtaining current remaining available energy in another embodiment of a method for determining available energy of a battery according to this disclosure.

FIG. 3 is a schematic diagram of obtaining current remaining available energy in another embodiment of a method for determining available energy of a battery according to this disclosure. As shown in FIG. 3:

Step 301. Obtain, based on battery state information, first battery remaining available energy corresponding to a state of the battery without a recoverable attenuation capacity.

A plurality of methods may be used for obtaining first battery remaining available energy corresponding to a state of the battery without a recoverable attenuation capacity. When there is no recoverable capacity attenuation, current remaining available energy of the battery under different SOCs and temperature conditions may be demarcated offline, and a mapping relationship may be established.

For example, a mapping relationship between first battery remaining available energy and SOCs and temperatures of the battery is pre-established, to help obtain current remaining available energy of the battery under each temperature and SOC when there is no recoverable capacity attenuation. The mapping relationship may be a table, a fitting relationship formula, or the like. The first battery remaining available energy is obtained based on the mapping relationship and the battery state information, where the battery state information includes SOC and temperature information.

Step 302. Calculate current remaining available energy of the battery based on the first battery remaining available energy and one of the recoverable energy attenuation amount and the recoverable energy attenuation variation.

Figure 4:
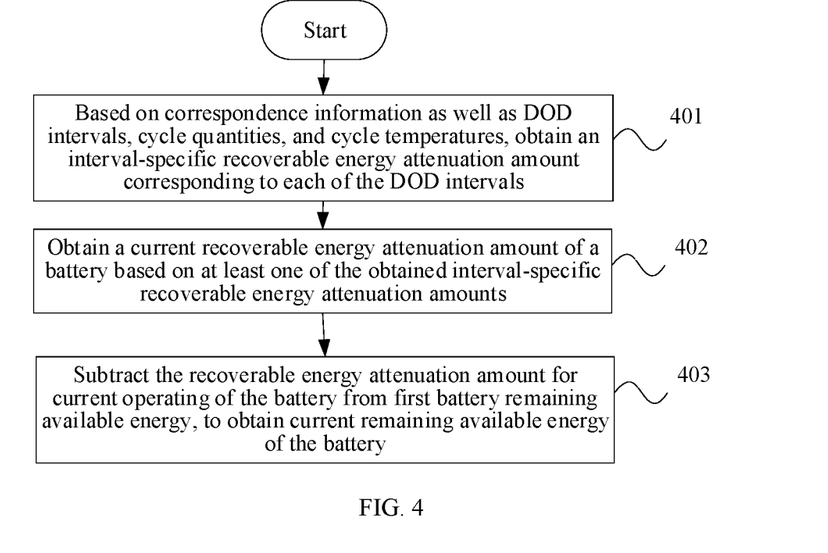
FIG. 4 is a schematic diagram of obtaining current remaining available energy based on a recoverable energy attenuation amount in another embodiment of a method for determining available energy of a battery according to this disclosure.

FIG. 4 is a schematic diagram of obtaining current remaining available energy based on a recoverable energy attenuation amount in another embodiment of a method for determining available energy of a battery according to this disclosure. As shown in FIG. 4:

Step 401. Based on correspondence information as well as DOD intervals, cycle quantities, and cycle temperatures, obtain an interval-specific recoverable energy attenuation amount corresponding to each of the DOD intervals.

Step 402. Obtain a current recoverable energy attenuation amount of the battery at operation based on at least one of the obtained interval-specific recoverable energy attenuation amounts.

For example, an SOC interval for battery operating may be obtained as a first SOC to a second SOC; a plurality of DOD intervals corresponding to the SOC interval are obtained; and a cycle quantity and a cycle temperature that correspond to each DOD interval are obtained. The interval-specific recoverable energy attenuation amount corresponding to each of the DOD intervals may be obtained by using table look-up or a functional relationship, and based on the DOD intervals, the cycle quantities, and the cycle temperatures. The plurality of obtained interval-specific recoverable energy attenuation amounts may be added up to obtain the recoverable energy attenuation amount for current operating of the battery.

Step 403. Subtract the recoverable energy attenuation amount from the first battery remaining available energy, to obtain current remaining available energy of the battery.

Current remaining available energy E1 of the battery that corresponds to a state of the battery without a recoverable attenuation capacity is obtained based on battery state information. An SOC interval for each charging operating is obtained. A DOD interval corresponding to the SOC interval, and a cycle quantity and a cycle temperature that correspond to the DOD interval are obtained. The recoverable energy attenuation amount dE of the battery is calculated by using table look-up or a functional relationship, and based on the DOD interval, the cycle quantity, and the cycle temperature. The current remaining available energy of the battery is calculated as follows: the current remaining available energy of the battery=E1−dE.

Figure 5:
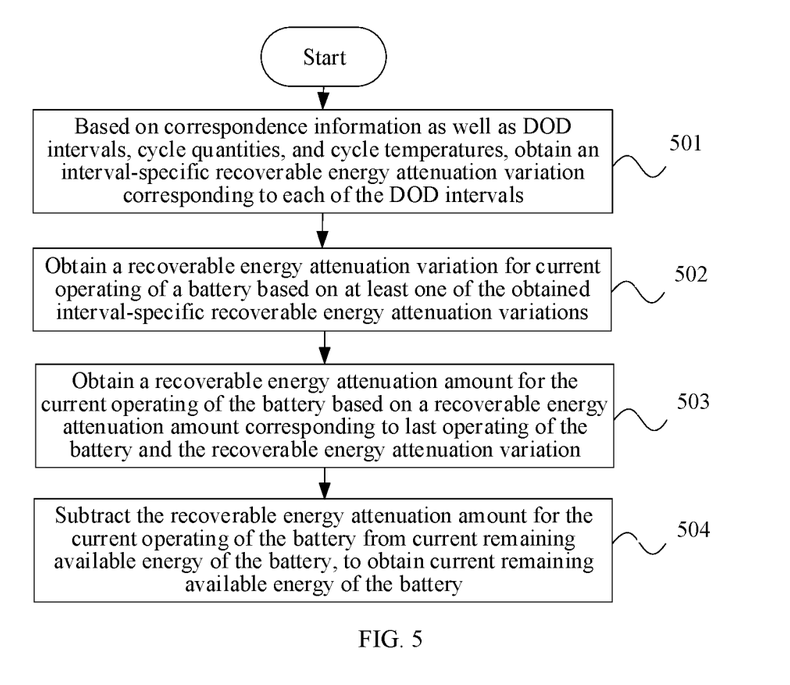
FIG. 5 is a schematic diagram of obtaining current remaining available energy based on a recoverable energy attenuation variation in another embodiment of a method for determining available energy of a battery according to this disclosure.

FIG. 5 is a schematic diagram of obtaining current remaining available energy based on a recoverable energy attenuation variation in another embodiment of a method for determining available energy of a battery according to this disclosure. As shown in FIG. 5:

Step 501. Based on correspondence information as well as DOD intervals, cycle quantities, and cycle temperatures, obtain an interval-specific recoverable energy attenuation variation corresponding to each of the DOD intervals.

Step 502. Obtain a recoverable energy attenuation variation for current operating of the battery based on at least one of the obtained interval-specific recoverable energy attenuation variations.

For example, an SOC interval for battery operating may be obtained as a first SOC to a second SOC; a plurality of DOD intervals corresponding to the SOC interval are obtained; and a cycle quantity and a cycle temperature that correspond to each DOD interval are obtained. An interval-specific recoverable energy attenuation variation corresponding to each DOD interval may be obtained by using table look-up or a functional relationship, and based on the DOD intervals, the cycle quantities, and the cycle temperatures. The plurality of obtained interval-specific recoverable energy attenuation variations may be added up to obtain the recoverable energy attenuation variation for current operating of the battery.

Step 503. Obtain a recoverable energy attenuation amount for current operating of the battery based on a recoverable energy attenuation amount corresponding to last operating of the battery and the recoverable energy attenuation variation.

Step 504. Subtract the recoverable energy attenuation amount from the first battery remaining available energy, to obtain current remaining available energy of the battery.

For example, current remaining available energy E1 of the battery that corresponds to a state of the battery without a recoverable attenuation capacity is obtained based on battery state information. An SOC interval for each charging operating is obtained. A DOD interval corresponding to the SOC interval, and a cycle quantity and a cycle temperature that correspond to the DOD interval are obtained. The recoverable energy attenuation amount dE' of the battery may be calculated by using table look-up or a functional relationship, and based on the DOD interval, the cycle quantity, and the cycle temperature. The recoverable energy attenuation amount dE0 corresponding to the last operating of the battery is obtained. The recoverable energy attenuation variation dE is updated as dE0−dE'. The current remaining available energy of the battery is calculated as follows: the current remaining available energy of the battery=E1−dE.

Figure 6:
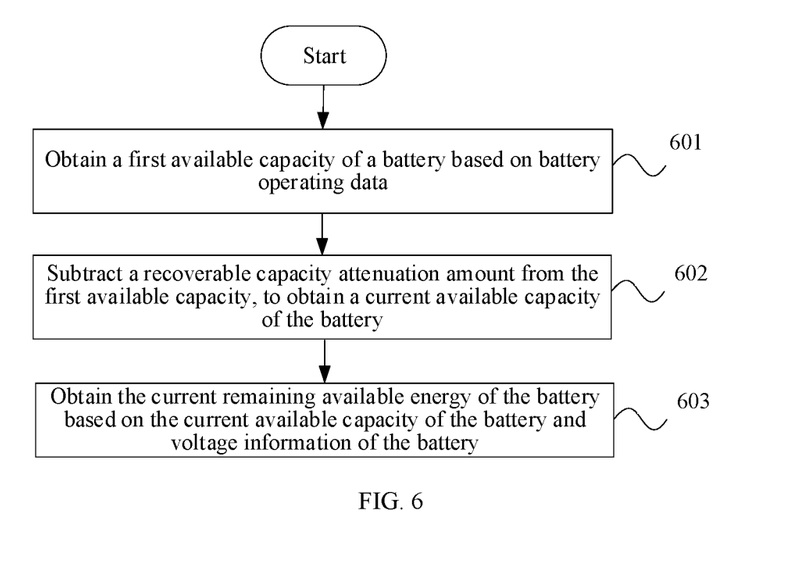
FIG. 6 is a schematic diagram of obtaining current remaining available energy based on a recoverable energy attenuation variation in still another embodiment of a method for determining available energy of a battery according to this disclosure.

In an embodiment, the current remaining available energy of the battery may be calculated based on an available capacity and a recoverable capacity attenuation amount. FIG. 6 is a schematic diagram of obtaining current remaining available energy based on a recoverable energy attenuation variation in still another embodiment of a method for determining available energy of a battery according to this disclosure. As shown in FIG. 6:

Step 601. Obtain a first available capacity of the battery based on battery operating data.

There may be a plurality of methods for obtaining the first available capacity of the battery, for example, calculating the first available capacity of the battery based on the battery operating data and by using linear interpolation of cumulative ampere-hours.

Step 602. Subtract a recoverable capacity attenuation amount from the first available capacity, to obtain a current available capacity of the battery.

There may be a plurality of methods for obtaining the recoverable capacity attenuation amount. Based on correspondence information as well as DOD intervals, cycle quantities, and cycle temperatures, an interval-specific recoverable capacity attenuation amount corresponding to each of the DOD intervals is obtained. The recoverable capacity attenuation amount is obtained based on at least one of the obtained interval-specific recoverable capacity attenuation amounts.

For example, an SOC interval may be obtained as a first SOC to a second SOC; a plurality of DOD intervals corresponding to the SOC interval are obtained; and a cycle quantity and a cycle temperature that correspond to each DOD interval are obtained. An interval-specific recoverable capacity attenuation amount corresponding to each of the DOD intervals may be obtained by using table look-up or a functional relationship, and based on DOD intervals, the cycle quantities, and the cycle temperatures. The plurality of obtained interval-specific recoverable capacity attenuation amounts may be added up to obtain the recoverable capacity attenuation amount for current operating of the battery.

Step 603. Obtain the current remaining available energy of the battery based on the current available capacity of the battery and voltage information of the battery.

For example, the voltage information of the battery may be an average voltage during discharging, and may be obtained based on SOC information and a temperature. A real capacity of the battery is calculated based on an available capacity and the recoverable capacity attenuation amount, and the current remaining available energy of the battery is calculated based on the average voltage. For example, $E_{tr}=(Q_t-Q_d)*U_{avg}$, where $E_{tr}$ is the current remaining available energy of the battery, $Q_t$ is the available capacity, $Q_d$ is the recoverable energy attenuation amount, and $U_{avg}$ is the average voltage during discharging. A plurality of methods may be used for obtaining the available capacity of the battery. For example, the battery operating data is obtained, and the available capacity of the battery is calculated by using linear interpolation of cumulative ampere-hours.

Figure 7:
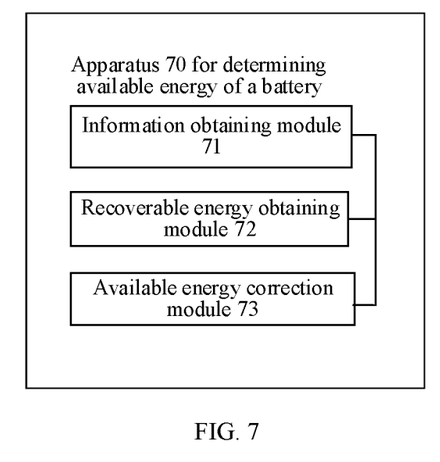
FIG. 7 is a schematic modular diagram of an embodiment of an apparatus for determining available energy of a battery according to this disclosure.

In an embodiment, this disclosure provides an apparatus for determining available energy of a battery 70, including: an information obtaining module 71, a recoverable energy obtaining module 72, and an available energy correction module 73. The information obtaining module 71 obtains a DOD interval corresponding to an SOC interval for battery operating, and obtains a cycle quantity and a cycle temperature that correspond to the DOD interval. The information obtaining module 71 may obtain setting information for DOD interval setting in an SOC usage interval corresponding to the battery, and determine the DOD interval corresponding to the SOC interval based on the setting information.

The recoverable energy obtaining module 72 obtains recoverable energy information of the battery based on the DOD interval, the cycle quantity, and the cycle temperature. The recoverable energy information includes a recoverable energy attenuation amount, a recoverable energy attenuation variation, a recoverable capacity attenuation amount, or the like. The recoverable energy obtaining module 72 may pre-establish correspondence information between recoverable energy information, and DOD intervals, cycle quantities, and cycle temperatures; and obtain, based on the correspondence information, the recoverable energy information corresponding to the DOD interval and the cycle quantity. The available energy correction module 73 determines current remaining available energy of the battery based on the recoverable energy information.

Figure 8:
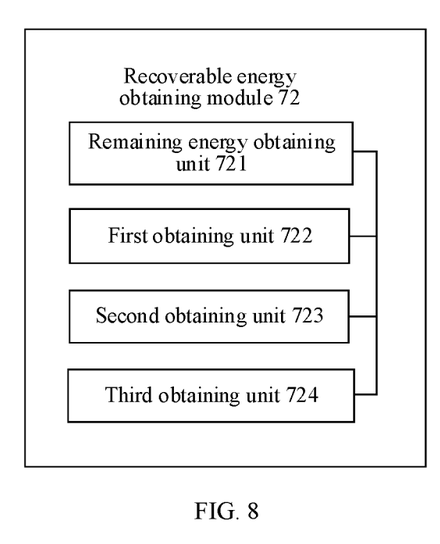
FIG. 8 is a schematic modular diagram of a recoverable energy module in an embodiment of an apparatus for determining available energy of a battery according to this disclosure.

As shown in FIG. 8, the recoverable energy obtaining module 72 includes a remaining energy obtaining unit 721, a first obtaining unit 722, a second obtaining unit 723, and a third obtaining unit 724. The remaining energy obtaining unit 721 obtains, based on battery state information, first battery remaining available energy corresponding to a state of the battery without a recoverable attenuation capacity. The remaining energy obtaining unit 721 pre-establishes a mapping relationship between first battery remaining available energy, and SOCs and temperatures of the battery; and obtains the first battery remaining available energy based on the mapping relationship and the battery state information. The battery state information includes SOC and temperature information, and the like.

The first obtaining unit 722 calculates the current remaining available energy of the battery based on the first battery remaining available energy and a recoverable energy attenuation amount. The second obtaining unit 723 calculates the current remaining available energy of the battery based on the first battery remaining available energy and a recoverable energy attenuation variation.

In an embodiment, the first obtaining unit 722 obtains, based on the correspondence information as well as the DOD intervals, the cycle quantities, and the cycle temperatures, an interval-specific recoverable energy attenuation amount corresponding to each of the DOD intervals. The first obtaining unit 722 obtains the recoverable energy attenuation amount for current operating of the battery based on at least one of the obtained interval-specific recoverable energy attenuation amounts. The first obtaining unit 722 subtracts the recoverable energy attenuation amount from the first battery remaining available energy, to obtain the current remaining available energy of the battery.

The second obtaining unit 723 obtains, based on the correspondence information as well as the DOD intervals, the cycle quantities, and the cycle temperatures, an interval-specific recoverable energy attenuation variation corresponding to each of the DOD intervals. The second obtaining unit 723 obtains the recoverable energy attenuation variation for current operating of the battery based on at least one of the obtained interval-specific recoverable energy attenuation variations.

The second obtaining unit 723 obtains the recoverable energy attenuation amount for current operating of the battery based on a recoverable energy attenuation amount corresponding to last operating of the battery and the recoverable energy attenuation variation. The second obtaining unit 723 subtracts the recoverable energy attenuation amount from the first battery remaining available energy, to obtain the current remaining available energy of the battery.

The third obtaining unit 724 obtains a first available capacity of the battery based on battery operating data, and calculates the current remaining available energy of the battery based on the first available capacity and the recoverable capacity attenuation amount. The third obtaining unit 724 obtains, based on the correspondence information as well as the DOD intervals, the cycle quantities, and the cycle temperatures, an interval-specific recoverable capacity attenuation amount corresponding to each of the DOD intervals. The third obtaining unit 724 obtains the recoverable capacity attenuation amount based on at least one of the obtained interval-specific recoverable capacity attenuation amounts.

The third obtaining unit 724 subtracts the recoverable capacity attenuation amount from an available capacity, to obtain a current available capacity of the battery, and obtains the current remaining available energy of the battery based on the current available capacity of the battery and voltage information of the battery.

Figure 9:
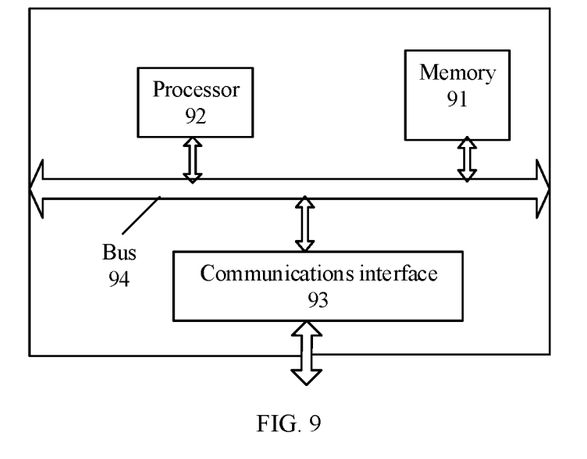
FIG. 9 is a schematic modular diagram of another embodiment of an apparatus for determining available energy of a battery according to this disclosure.

FIG. 9 is a schematic modular diagram of another embodiment of an apparatus for determining available energy of a battery according to this disclosure. As shown in FIG. 9, the apparatus may include a memory 91, a processor 92, a communications interface 93, and a bus 94. The memory 91 is configured to store an instruction. The processor 92 is coupled to the memory 91. The processor 92 is configured to perform, according to the instruction stored in the memory 91, the foregoing method for determining available energy of a battery.

The memory 91 may be a high-speed RAM memory, a non-volatile memory (non-volatile memory), or the like; or the memory 91 may be a memory array. The memory 91 may be alternatively divided into blocks, and the blocks may be combined into a virtual volume according to a specific rule. The processor 92 may be a central processing unit CPU, or an application-specific integrated circuit ASIC (Application Specific Integrated Circuit), or one or more integrated circuits that are configured to implement the method for determining available energy of a battery in this disclosure.

In an embodiment, this disclosure provides a battery management system, including the apparatus for determining available energy of a battery in any one of the foregoing embodiments. The battery management system may be installed on an automobile or the like, and can manage a battery.

In an embodiment, this disclosure provides a computer readable storage medium. The computer readable storage medium stores a computer instruction. When the instruction is executed by a processor, the method for determining available energy of a battery in any one of the foregoing embodiments is implemented.

According to the method and the apparatus for determining available energy of a battery, the battery management system, and the storage medium in the foregoing embodiments, the DOD interval corresponding to the SOC interval for battery operating, and the cycle quantity and the cycle temperature that correspond to the DOD interval are obtained; the recoverable energy information of the battery is obtained based on the DOD interval, the cycle quantity, and the cycle temperature; and the current remaining available energy of the battery is corrected. For a battery with a recoverable attenuation capacity, recoverable energy information of the battery is obtained, and remaining available energy of the battery is estimated based on the recoverable energy information. The recoverable energy information may be a recoverable energy attenuation amount, a recoverable energy attenuation variation, or a recoverable capacity attenuation amount. This could help improve accuracy in estimating remaining available energy of the battery, thereby improving battery reliability and prolonging a service life of the battery.

The method and the system in this disclosure may be implemented in many ways. For example, the method and the system in this disclosure may be implemented by software, hardware, firmware, or any combination of software, hardware, and firmware. The foregoing sequence of the steps of the method is merely intended for illustration, and the steps of the method in this disclosure are not limited to the sequence in the foregoing specific description, unless otherwise specified. In addition, in some embodiments, this disclosure may be alternatively implemented as programs recorded in a recording medium, and the programs include machine readable instructions for implementing the method according to this disclosure. Therefore, this disclosure further covers the recording medium that stores the programs for performing the method in this disclosure.

The descriptions of this disclosure are given for the sake of examples and illustration, and are not exhaustive or limiting this disclosure to the disclosed forms. Many modifications and changes are apparent to a person of ordinary skill in the art. The embodiments are selected and described to better explain the principles and the practical application of this disclosure, so that a person of ordinary skill in the art can understand this disclosure and design various embodiments with various modifications for specific uses.

What is claimed is:

1. A method for determining available energy of a battery, performed at an apparatus that includes one or more processors and memory, the method comprising:
    establishing a connection between the apparatus and the battery through a communications interface of the apparatus;
    obtaining, via the connection between the apparatus and the battery, a depth of discharge (DOD) interval corresponding to a current state of charge (SOC) interval of the battery;
    obtaining, via the connection between the apparatus and the battery, a quantity of cycles and cycle temperature that correspond to the DOD interval;
    obtaining, via the connection between the apparatus and the battery, recoverable energy information of the battery based on the DOD interval, the quantity of cycles, and the cycle temperature, wherein the recoverable energy information includes a recoverable energy attenuation amount, a recoverable energy attenuation variation, and a recoverable capacity attenuation amount, wherein the obtaining recoverable energy information of the battery based on the DOD interval, the quantity of cycles, and the cycle temperature includes:
        pre-establishing, through a plurality of capacity test and energy test procedures, correspondence information between the recoverable energy information, and the DOD interval, the quantity of cycles, and the cycle temperature; and
        obtaining, based on the correspondence information, the recoverable energy information corresponding to the DOD interval and the quantity of cycles; and
    determining current remaining available energy of the battery based on the recoverable energy information.

2. The method according to claim 1, wherein there are multiple DOD intervals corresponding to the SOC interval.

3. The method according to claim 1, wherein the determining current remaining available energy of the battery based on the recoverable energy information comprises:
    obtaining, based on battery state information, first battery remaining available energy corresponding to a state of the battery without a recoverable attenuation capacity; and
    calculating the current remaining available energy of the battery based on the first battery remaining available energy and one of the recoverable energy attenuation amount and the recoverable energy attenuation variation.

4. The method according to claim 3, wherein the obtaining, based on the correspondence information, the recoverable energy information corresponding to the DOD interval and the quantity of cycles comprises:

obtaining an interval-specific recoverable energy attenuation amount corresponding to the each DOD interval, based on the correspondence information, the DOD interval, the quantity of cycles, and the cycle temperature; and obtaining a current recoverable energy attenuation amount of the battery based on the obtained interval-specific recoverable energy attenuation amount; and wherein the calculating the current remaining available energy of the battery based on the first battery remaining available energy and the recoverable energy attenuation amount comprises:

subtracting the recoverable energy attenuation amount from the first battery remaining available energy, to obtain the current remaining available energy of the battery.

5. The method according to claim 3, wherein the obtaining, based on the correspondence information, the recoverable energy information corresponding to the DOD interval and the quantity of cycles comprises:

obtaining an interval-specific recoverable energy attenuation variation corresponding to the DOD interval, based on the correspondence information, the DOD interval, the quantity of cycles, and the cycle temperature; and obtaining a current recoverable energy attenuation variation of the battery based on the obtained interval-specific recoverable energy attenuation variation; and wherein the calculating the current remaining available energy of the battery based on the battery remaining available energy and the recoverable energy attenuation amount comprises:

obtaining a current recoverable energy attenuation amount of the battery based on a previous recoverable energy attenuation amount of the battery and a current recoverable energy attenuation variation of the battery; and subtracting the recoverable energy attenuation amount from the first battery remaining available energy, to obtain the current remaining available energy of the battery.

6. The method according to claim 1, wherein the determining current remaining available energy of the battery based on the recoverable energy information comprises:

obtaining a first available capacity of the battery based on battery operating data; and calculating the current remaining available energy of the battery based on the first available capacity and the recoverable capacity attenuation amount.

7. The method according to claim 6, wherein the obtaining, based on the correspondence information, the recoverable energy information corresponding to the DOD interval and the quantity of cycles comprises:

obtaining an interval-specific recoverable capacity attenuation amount corresponding to the DOD interval, based on the correspondence information, the DOD interval, the quantity of cycles, and the cycle temperature; and obtaining the recoverable capacity attenuation amount based on the obtained interval-specific recoverable capacity attenuation amount; and wherein the calculating the current remaining available energy of the battery based on the first available capacity and the recoverable capacity attenuation amount comprises:

subtracting the recoverable capacity attenuation amount from the first available capacity, to obtain a current available capacity of the battery; and obtaining the current remaining available energy of the battery based on the current available capacity of the battery and voltage information of the battery.

8. An apparatus for determining available energy of a battery, comprising:

a memory;

a processor; and a plurality of instructions stored in the memory that, when executed by the processor, cause the apparatus to perform operations comprising:

establishing a connection between the apparatus and the battery through a communications interface of the apparatus;

obtaining, via the connection between the apparatus and the battery, a depth of discharge (DOD) interval corresponding to a current state of charge (SOC) interval of the battery;

obtaining, via the connection between the apparatus and the battery, a quantity of cycles and cycle temperature that correspond to the DOD interval;

obtaining, via the connection between the apparatus and the battery, recoverable energy information of the battery based on the DOD interval, the quantity of cycles, and the cycle temperature, wherein the recoverable energy information comprises a recoverable energy attenuation amount, a recoverable energy attenuation variation, and a recoverable capacity attenuation amount, wherein the obtaining recoverable energy information of the battery based on the DOD interval, the quantity of cycles, and the cycle temperature includes:

pre-establishing, through a plurality of capacity test and energy test procedures, correspondence information between the recoverable energy information, and the DOD interval, the quantity of cycles, and the cycle temperature; and obtaining, based on the correspondence information, the recoverable energy information corresponding to the DOD interval and the quantity of cycles; and determining current remaining available energy of the battery based on the recoverable energy information.

9. The apparatus according to claim 8, wherein the apparatus is configured to:

obtain, based on battery state information, first battery remaining available energy corresponding to a state of the battery without a recoverable attenuation capacity; and calculate the current remaining available energy of the battery based on the first battery remaining available energy and one of the recoverable energy attenuation amount and the recoverable energy attenuation variation.

10. The apparatus according to claim 9, wherein the apparatus is configured to:

obtain an interval-specific recoverable energy attenuation amount corresponding to the DOD interval, based on the correspondence information, the DOD interval, the quantity of cycles, and the cycle temperature;

obtain a current recoverable energy attenuation amount of the battery based on the obtained interval-specific recoverable energy attenuation amount; and subtract the recoverable energy attenuation amount from the first battery remaining available energy, to obtain the current remaining available energy of the battery.

11. The apparatus according to claim 9, wherein the apparatus is configured to:

obtain an interval-specific recoverable energy attenuation variation corresponding to the DOD interval, based on the correspondence information as well as the DOD interval, the quantity of cycles, and the cycle temperature;

obtain a current recoverable energy attenuation variation of the battery based on the obtained interval-specific recoverable energy attenuation variation;

obtain a current recoverable energy attenuation amount of the battery based on a previous recoverable energy attenuation amount and a current recoverable energy attenuation variation of the battery; and subtract the recoverable energy attenuation amount from the first battery remaining available energy, to obtain the current remaining available energy of the battery.

12. The apparatus according to claim 9, wherein the apparatus is configured to:

obtain a first available capacity of the battery based on battery operating data; and calculate the current remaining available energy of the battery based on the first available capacity and the recoverable capacity attenuation amount.

13. The apparatus according to claim 12, wherein the apparatus is configured to:

obtain an interval-specific recoverable capacity attenuation amount corresponding to the DOD interval, based on the correspondence information as well as the DOD interval, the quantity of cycles, and the cycle temperature;

obtain the recoverable capacity attenuation amount based on the obtained interval-specific recoverable capacity attenuation amount;

subtract the recoverable capacity attenuation amount from the first available capacity, to obtain a current available capacity of the battery; and obtain the current remaining available energy of the battery based on the current available capacity of the battery and voltage information of the battery.

* * * * *